(12) United States Patent
Barkley et al.

(10) Patent No.: US 10,885,945 B2
(45) Date of Patent: Jan. 5, 2021

(54) APPARATUS AND METHODS TO PERFORM READ-WHILE WRITE (RWW) OPERATIONS

(71) Applicant: Micron Technology, Inc., Boise, ID (US)

(72) Inventors: Gerald John Barkley, Oregon, WI (US); Daniele Vimercati, El Dorado Hills, CA (US); Pierguido Garofalo, San Donato M.se (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/688,667

(22) Filed: Aug. 28, 2017

(65) Prior Publication Data

US 2017/0358328 A1    Dec. 14, 2017

Related U.S. Application Data

(60) Continuation of application No. 14/668,812, filed on Mar. 25, 2015, now Pat. No. 9,767,857, which is a
(Continued)

(51) Int. Cl.
*G11C 5/02* (2006.01)
*G11C 8/12* (2006.01)
(Continued)

(52) U.S. Cl.
CPC ............ *G11C 5/025* (2013.01); *G11C 7/1042* (2013.01); *G11C 8/12* (2013.01); *G11C 13/0004* (2013.01);
(Continued)

(58) Field of Classification Search
CPC ... G11C 5/025; G11C 13/0069; G11C 13/004; G11C 13/0004; G11C 16/26;
(Continued)

(56) References Cited

U.S. PATENT DOCUMENTS

| 5,349,563 A | 9/1994 | Iwase |
| 5,847,998 A | 12/1998 | Van Buskirk |

(Continued)

FOREIGN PATENT DOCUMENTS

| KR | 20090037765 A * | 4/2009 |
| WO | WO 2012168954 A1 | 12/2012 |

OTHER PUBLICATIONS

ISA/EPO, International Search Report and Written Opinion of the International Searching Authority, Int'l. Appl. No. PCT/IT2011/000195, dated Jun. 22, 2012, European Patent Office, Rijswijk, NL, 14 pgs.

*Primary Examiner* — Vanthu T Nguyen
(74) *Attorney, Agent, or Firm* — Holland & Hart LLP

(57) ABSTRACT

A plurality of block configurations may be employed for read while write operations. In one apparatus example, a plurality of block configurations may be employed. Block configurations may include an arrangement of similarly doped semiconductor switches. Block configurations may select a respective tile of a memory array, a particular memory cell of the respective tile, and select a memory operation to apply to the particular memory cell. Immediately adjacent block configurations within a particular slice of the memory array may be substantially mirrored and immediately adjacent block configurations in separate immediately adjacent slices of the memory array may be substantially similar. Similarly doped diffusion regions for similarly doped semiconductor switches in substantially mirrored block configurations may be arranged to electrically share a common potential signal value level. Other apparatus and methods are also disclosed.

14 Claims, 7 Drawing Sheets

Related U.S. Application Data division of application No. 13/384,999, filed as application No. PCT/IT2011/000195 on Jun. 10, 2011, now Pat. No. 8,995,161.

(51) Int. Cl.

| | | |
|---|---|---|
| *G11C 16/08* | (2006.01) | |
| *G11C 7/10* | (2006.01) | |
| *G11C 16/26* | (2006.01) | |
| *G11C 16/10* | (2006.01) | |
| *G11C 13/00* | (2006.01) | |

(52) U.S. Cl.
CPC ........ *G11C 13/004* (2013.01); *G11C 13/0069* (2013.01); *G11C 16/08* (2013.01); *G11C 16/10* (2013.01); *G11C 16/26* (2013.01)

(58) Field of Classification Search
CPC ....... G11C 7/1042; G11C 16/10; G11C 16/08; G11C 8/12
See application file for complete search history.

(56) References Cited

U.S. PATENT DOCUMENTS

| | | | |
|---|---|---|---|
| 5,923,587 A * | 7/1999 | Choi | G11C 11/5621 365/185.11 |
| 5,943,285 A | 8/1999 | Kohno | |
| 6,011,717 A | 1/2000 | Brigati et al. | |
| 6,114,724 A | 9/2000 | Ratnakumar | |
| 6,188,597 B1 | 2/2001 | Takita et al. | |
| 6,512,693 B2 | 1/2003 | Honda et al. | |
| 6,532,173 B2 | 3/2003 | Iioka et al. | |
| 6,584,034 B1 | 6/2003 | Hsu et al. | |
| 6,772,273 B1 | 8/2004 | Tedrow et al. | |
| 6,809,947 B2 | 10/2004 | Alexanian | |
| 6,829,194 B2 | 12/2004 | Honda et al. | |
| 6,865,133 B2 | 3/2005 | Tsukidate et al. | |
| 7,046,559 B2 | 5/2006 | Saito | |
| 7,092,289 B1 | 8/2006 | Wong | |
| 7,400,534 B2 * | 7/2008 | Maejima | G11C 16/0483 257/E21.682 |
| 7,423,909 B2 | 9/2008 | Shinozaki et al. | |
| 7,512,003 B2 | 3/2009 | Yoo et al. | |
| 8,233,322 B2 | 7/2012 | Pekny et al. | |
| 8,395,923 B2 * | 3/2013 | Chen | G11C 17/18 365/94 |
| 8,942,039 B2 | 1/2015 | Sakurai et al. | |
| 2008/0279033 A1 | 11/2008 | Shinozaki et al. | |

* cited by examiner

APPARATUS AND METHODS TO PERFORM READ-WHILE WRITE (RWW) OPERATIONS

CROSS REFERENCES

The present Application for Patent is a continuation of U.S. patent application Ser. No. 14/668,812 by Barkley et al., entitled "Apparatus and Methods to Perform Read-While Write (RWW) Operations," filed Mar. 25, 2015, which is divisional of U.S. patent application Ser. No. 13/384,999 by Barkley et al., entitled "Apparatus and Methods to Perform Read-While Write (RWW) Operations," filed Jan. 19, 2012, which is a U.S. national phase entry of PCT/IT2011/000195 by Barkley et al., entitled "Apparatus and Methods to Perform Read-While Write (RWW) Operations," filed Jun. 10, 2011, assigned to the assignee hereof, and each of which is expressly incorporated by reference in its entirety herein.

BACKGROUND

Field

The present disclosure relates to apparatus, such as memory devices and, more particularly in at least one embodiment, to RWW memory operations.

Information

Nonvolatile memory refers to a type of memory that does not require power to maintain a particular memory state. Examples may include flash memory, such as NOR flash or NAND flash, or phase change memory. However, writing a memory state to a memory cell in some technologies may involve a longer process than reading a memory state from a memory cell. It, therefore, may be desirable for memory to include a read-while write (RWW) capability. For memory having this capability, it is possible to write to some memory cells while reading from other memory cells concurrently.

BRIEF DESCRIPTION OF THE DRAWINGS

Non-limiting and non-exhaustive implementations will be described with reference to the following figures, wherein like reference numerals refer to like parts throughout the various figures unless otherwise specified.

DETAILED DESCRIPTION

Figure 1:
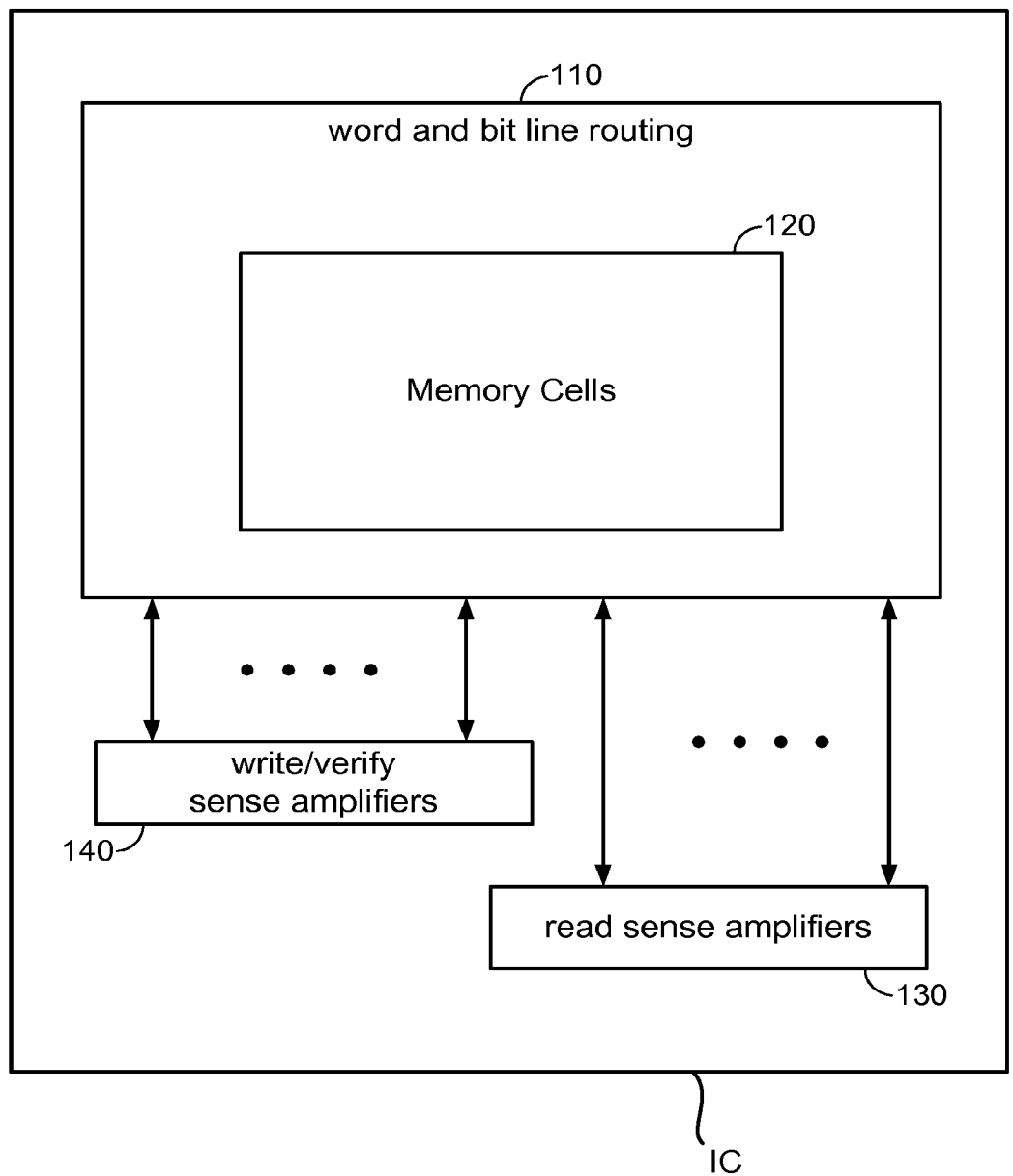
FIG. 1 is a schematic diagram illustrating an embodiment of a memory device.

Reference throughout this specification to "one implementation", "an implementation", "certain implementations", "one embodiment", "an embodiment", "certain embodiments", or the like means that a particular feature, structure, or characteristic described in connection with a described implementation(s) or embodiment(s) may be included in at least one implementation(s) or embodiment(s) of claimed subject matter. Thus, appearances of the phrase "in one example implementation", "in an example implementation," "in certain example implementations," "in one example embodiment", "in an example embodiment," "in certain example embodiments," or the like in various places throughout this specification are not necessarily all referring to the same implementation(s) or embodiment(s). Furthermore, particular features, structures, or characteristics may be combined in one or more implementations or embodiments.

It is expected that a variety of apparatus, such as consumer devices, including cell phones, personal digital assistants, desktop computers, tablet computers, laptop computers or any combination thereof, as well as other communications or computing devices, may make use of a variety of types of nonvolatile memory, including, as examples, flash memory or phase change memory (PCM). However, writing a memory state to a memory cell in some technologies may involve a longer process than reading a memory state from a memory cell. It, therefore, may be desirable for memory to include a read-while write (RWW) capability. For memory having this capability, it is possible to write to some memory cells while reading from other memory cells concurrently.

As suggested above, an architecture providing a capability to perform a read while write operation, such as for phase change memory and/or flash memory, may be desirable. A common method for enabling a RWW architecture includes replicating sense circuitry (e.g., sense amplifier circuits) and separate memory partitions. Typically, a memory device may include multiple partitions. In a RWW architecture, any two partitions may be activated concurrently. Therefore, one partition may be involved in writing one or more memory states, whereas another may be involved in reading one or more memory states. However, replicating sense circuitry in multiple or even every partition to enable RWW capability may result in extra sense circuitry and, therefore, may be costly. For example, if one partition is reading and another partition is writing, 6 or 14 partitions may remain inactivate for a device having 8 or 16 partitions, for example.

However, one approach to a RWW architecture may include, for a memory array, multiple partitions, but with common sense circuitry, instead of a separate set of sense circuitry per partition. See, for example, US Patent Publication 2005/0081013, by Penkny et al., titled "Multi-Partition Architecture for Memory," filed on Oct. 10, 2003, and published on Apr. 14, 2005, assigned to the assignee of the currently claimed subject matter. However, decoding appropriate signals may become more complex. For example, it may be desirable in at least some circumstance to employ two decoding paths rather than one, as described in more detail later. A memory state may be written to a sense amplifier, for example, in a manner handled differently than a manner in which a memory state of a sense amplifier may be read. While this may introduce additional complexity, such as perhaps including an additional signal path and also perhaps additional decoding, nonetheless, in comparison with employing extra sense amplifiers and related circuitry, it may be desirable in at least some situations.

FIG. 1 illustrates one example of an embodiment of a memory array 120 in which one set of read sense amplifiers and verify/write sense amplifiers may be employed, for example, although it is noted that some sense amplifiers, such as 130, are employed for reading whereas others, such as 140, are employed for writing/verifying. Of course, it is appreciated that this is merely one illustrative example. Another example may be included in the patent publication cited above. Furthermore, FIG. 1 does not illustrate a mechanism for decoding. As suggested previously, decoding of signals may involve some complexity, such as, in a situation, for example, involving multiple partitions and sense circuitry for reading and verify/writing that may interoperate with multiple partitions so that a RWW operation may be performed.

Figure 2A:
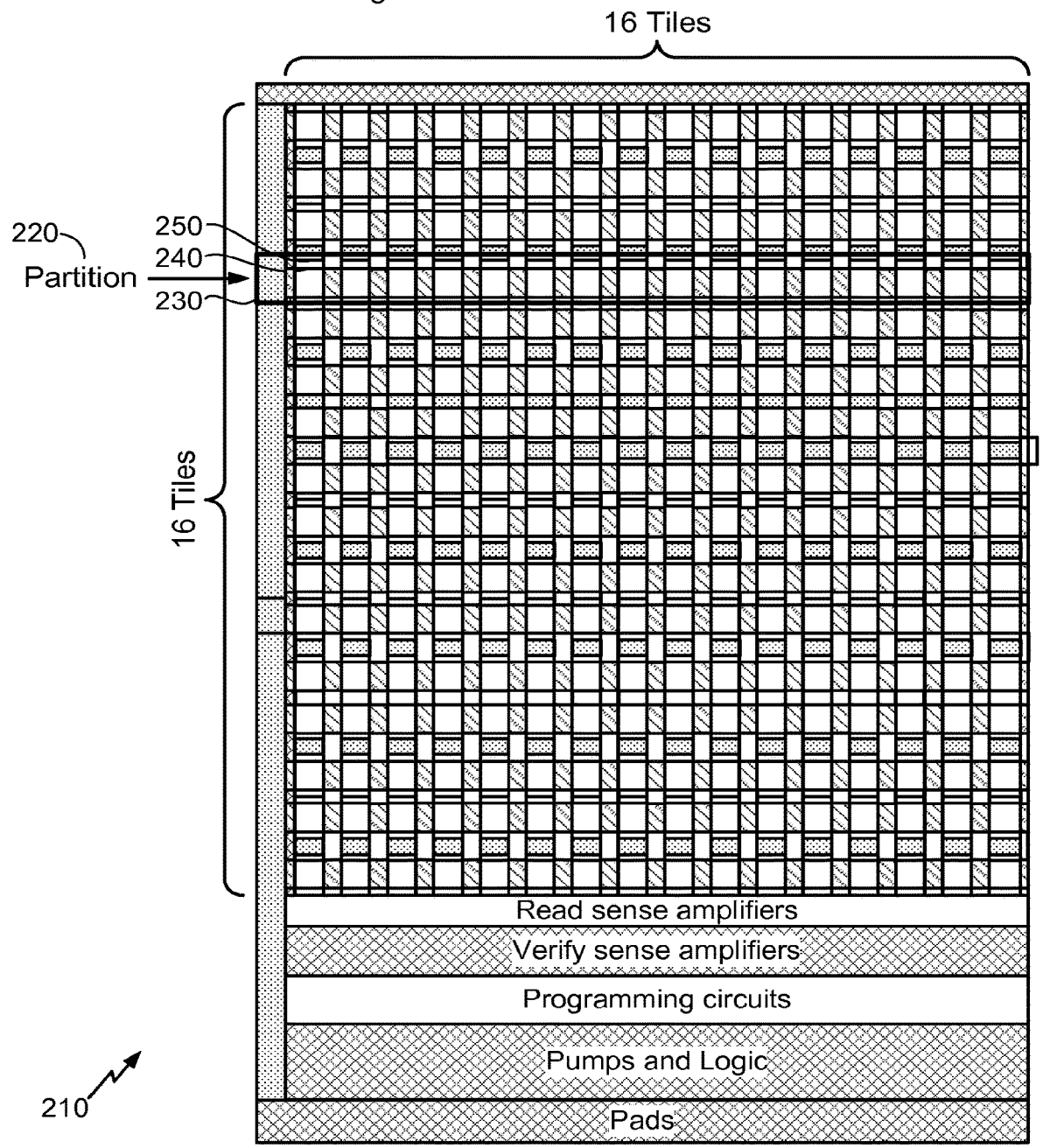
FIGS. 2A and B are corresponding layout diagrams illustrating an embodiment of a memory device including a read-while write (RWW) capability.

FIGS. 2A and B are corresponding diagrams illustrating a layout for an apparatus, such as an integrated circuit (IC) chip, that may employ a RWW architecture in which dual path decoding may be employed. It is noted, again, that claimed subject matter is not limited in scope to any particular embodiment, including the embodiment illustrated. Nonetheless, an integrated circuit is illustrated as including a 16×16 array of memory tiles. For example, a memory array may include 16 partitions. A partition may include 16 tiles and a tile may include 16 memory cells. Of course, these are merely illustrative examples; however, continuing with this illustration, a partition may, for example, read or write 256 bits at a time. Therefore, 256 sense amplifiers may, for example, correspond to 256 bits; however, for a read while write capability, reading or writing may occur. Therefore, for example, 512 sense amplifiers may be employed in which 256 sense amplifiers comprise read sense amplifiers and 256 sense amplifiers comprise verify/write sense amplifiers in an illustrative implementation or embodiment. It may be typically in some embodiments to employ similar signal paths for writing and verifying; hence, the term verify/write sense amplifiers. It is noted, however, that claimed subject matter is not limited to employing verify/write sense amplifiers. In some embodiments these may be separate or one or the other may be omitted, for example.

Although claimed subject matter is not limited in scope in this respect, in FIG. 2A, for example, memory array 210, for example, may comprise a phase change memory (PCM) array. In addition, in a first direction, for example, in at least one embodiment, circuitry may overlay memory tiles, which may comprise memory cells, so as to perform decoding or memory state reading/writing/verifying. Likewise, read sense circuitry and verify sense circuitry is likewise illustrated along a second direction substantially orthogonal to a first direction. For discussion purposes, a first direction may be referred to as vertical and a second direction may be referred to as horizontal, although, of course, claimed subject matter is not so limited. For example, first and second directions need not necessarily be substantially orthogonal in at least some embodiments. Additional circuitry, such as programming or logic circuitry and the like are also illustrated, although, again, FIG. 2A is intended as a non-limiting example provided merely for ease of understanding.

Figure 2B:
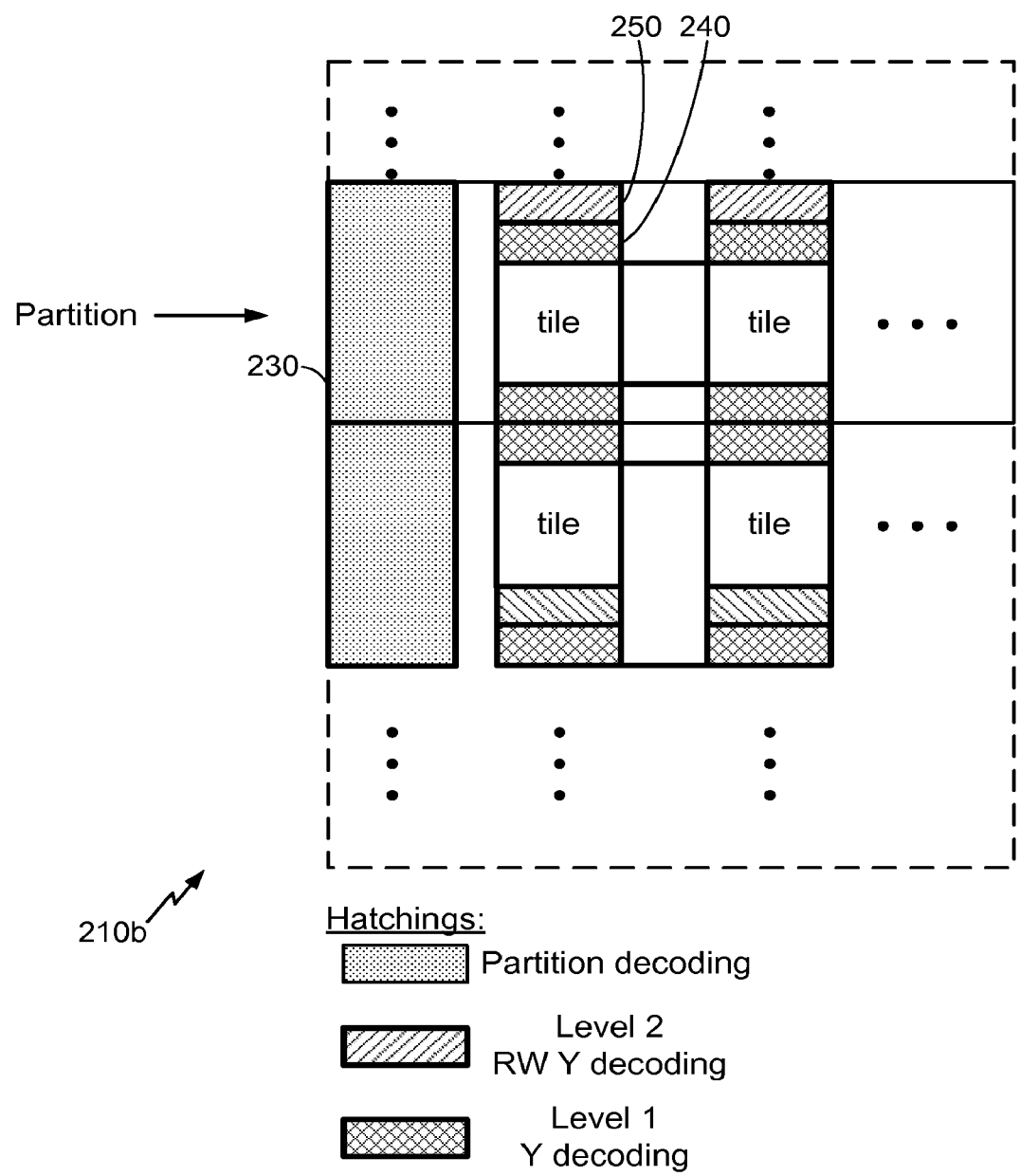

FIGS. 2A and 2B also include an example of a partition along a second direction. For a partition 220, various decoders, such as 230, 240 and 250 are also illustrated by different hatchings in FIG. 2B. Partitions and associated decoders, such as for an example implementation, are discussed in more detail below.

Figure 3:
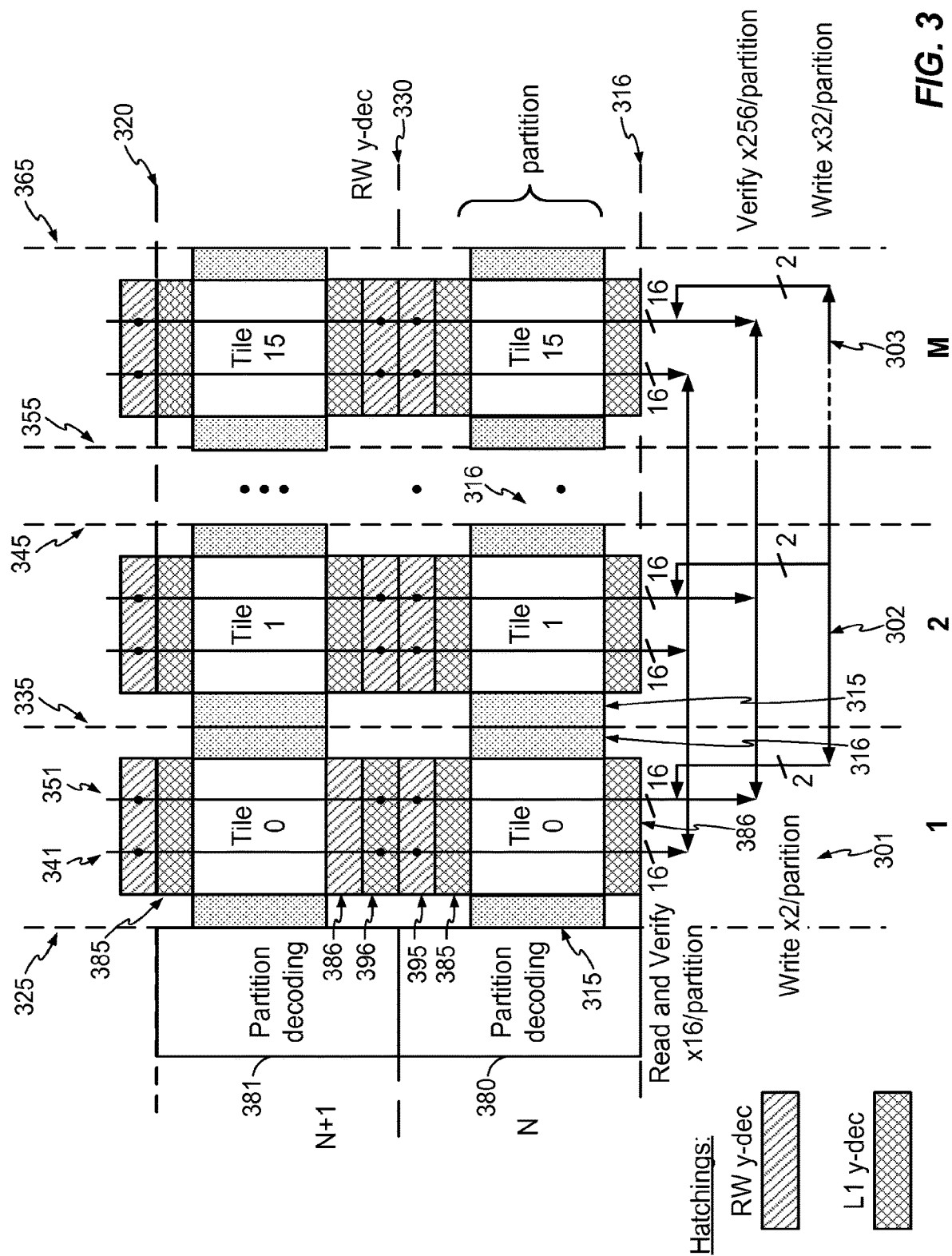
FIG. 3 is a circuit diagram illustrating the embodiment of FIGS. 2A and 2B in greater detail.

FIG. 3 is a schematic diagram illustrating a portion of two partitions in which memory tiles and accompanying decoder circuitry are also illustrated. Further, as explained in more detail below, decoder circuitry may be employed in connection with selection of memory cells within a memory tile. It is noted that partition 310 effectively comprises a mirror image of partition 320 formed across or about a dashed line 330, as shall be described in more detail hereinafter, and also illustrated in FIG. 3. Mirror image partitions comprise an example of a feature of at least one embodiment, although claimed subject matter is not limited in scope to employing this or other particular features. Some embodiments may include a feature, such as this particular feature, whereas some embodiments may omit a feature, such as this particular feature. Likewise, in at least one embodiment, partitions may comprise block configurations of circuitry. Continuing with FIG. 3, as indicated previously, block configurations, such as those illustrated, for example, may comprise an arrangement of similarly doped semiconductors switches. FIG. 2, for example, illustrates a 16 by 16 arrangement of block configurations, although claimed subject matter is not limited to any particular arrangement.

At a high level, in conjunction with partition decoding, a block configuration may be able to select a particular slice of a memory array, such as, for example, a respective combination of rows and/or columns, resulting in selection of a particular memory tile. Furthermore, memory cells within the particular memory tile may be selected through use of additional or second level decoding. Therefore, for a particular memory cell of a respective memory tile, a block configuration may select to read a state of the particular memory cell or to write a state to the particular memory cell.

Partitions N and N+1 are illustrated in FIG. 3, with partition N+1 corresponding to 320 and partition N corresponding to 310. Likewise, FIG. 3 illustrates portions of memory slices 301 and 302 in FIG. 3. Vertical dashed lines delineate boundaries of a memory slice. For example, memory slice 301 is bounded by dashed lines 325 and 335, and memory slice 302 is bounded by dashed lines 335 and 345. Similarly, a memory slice 303 is bounded by dashed lines 355 and 365. Vertical dashed lines, in conjunction with horizontal dashed line 330, therefore, illustrates six block configurations, three for partition 320 and three for partition 310.

Immediately adjacent block configurations within a particular slice may be substantially mirrored, whereas immediately adjacent block configurations in separate, immediately adjacent particular array slices may be substantially similar. For example, referring to block configurations corresponding to tiles 350, 360, 340 and 370, block configurations corresponding to tiles 350 and 360 are included in partition 320 and block configurations corresponding to tiles 340 and 370 are included in partition 310. However, block configurations corresponding to tiles 350 and 340 are included in memory slice 301 and block configurations corresponding to tiles 360 and 370 are included in memory slice 302. Therefore, as indicated previously, block configurations corresponding to tiles 350 and 360 are mirror images of block configurations corresponding to tiles 340 and 370, respectively; likewise, the block configuration corresponding to tile 350 is substantially similar to the block configuration corresponding to tile 360 and the block configuration corresponding to tile 340 is substantially similar to the block configuration corresponding to tile 370.

Tiles may comprise multiple memory cells, as indicated previously. For example, without limitation, as an illustrative example, a tile may include 16 memory cells. It is noted that FIG. 3 designates tiles as tile 0, tile 1, tile 2, etc., for ease of reference. Likewise, for at least one embodiment, three types of decoders may be provided for memory operation of a block configuration. Working in conjunction, these decoders provide an ability to designate memory cells and designated memory operations to be performed on the designated memory cells.

For example, referring to partition 310, partition decoder 380 is provided for partition N and partition decoder 381 is provided for partition N+1. Although terminology, such as X decoder or Y decoder, for example, are introduced for ease of discussion, this terminology is not meant to be limiting or imply a particular feature of a decoder not described. It is noted that in FIG. 3, X decoder may be abbreviated as "x-dec." For example, a block configuration may include an X decoder to select a particular partition and a Y decoder to select a particular memory slice. However, in at least one embodiment, a Y decoder may be handled as two decoders effectively—a level one Y decoder and a level two Y decoder. A level one Y decoder may select a particular memory slice (which may also be referred to as a "memory slice decoder"). It is noted that in FIG. 3, that a level one Y decoder may be abbreviated as "L 1 y-dec." It is worth noting that an X decoder and level one Y decoder may together, in effect, designate a particular memory tile. A level two Y decoder may be employed as a memory operation decoder to select a particular memory operation and provide further decoding so that a memory cell of a memory tile may be designated, for at least one embodiment. Therefore, a level two Y decoder may, in effect, perform two types of decoder operations. In addition to decoding the particular memory operation, it may also provide a mechanism to decode the particular memory cell of the particular memory tile to which the memory operation is to be applied. It is noted in FIG. 3, that a level two Y decoder may be abbreviated as "R/W-dec" or as "R/Wy-dec." In at least one embodiment, decoders may be employed in connection with a memory cell selection process. In this context, the terms select, selector and decoder can be used interchangeably.

Figure 4:
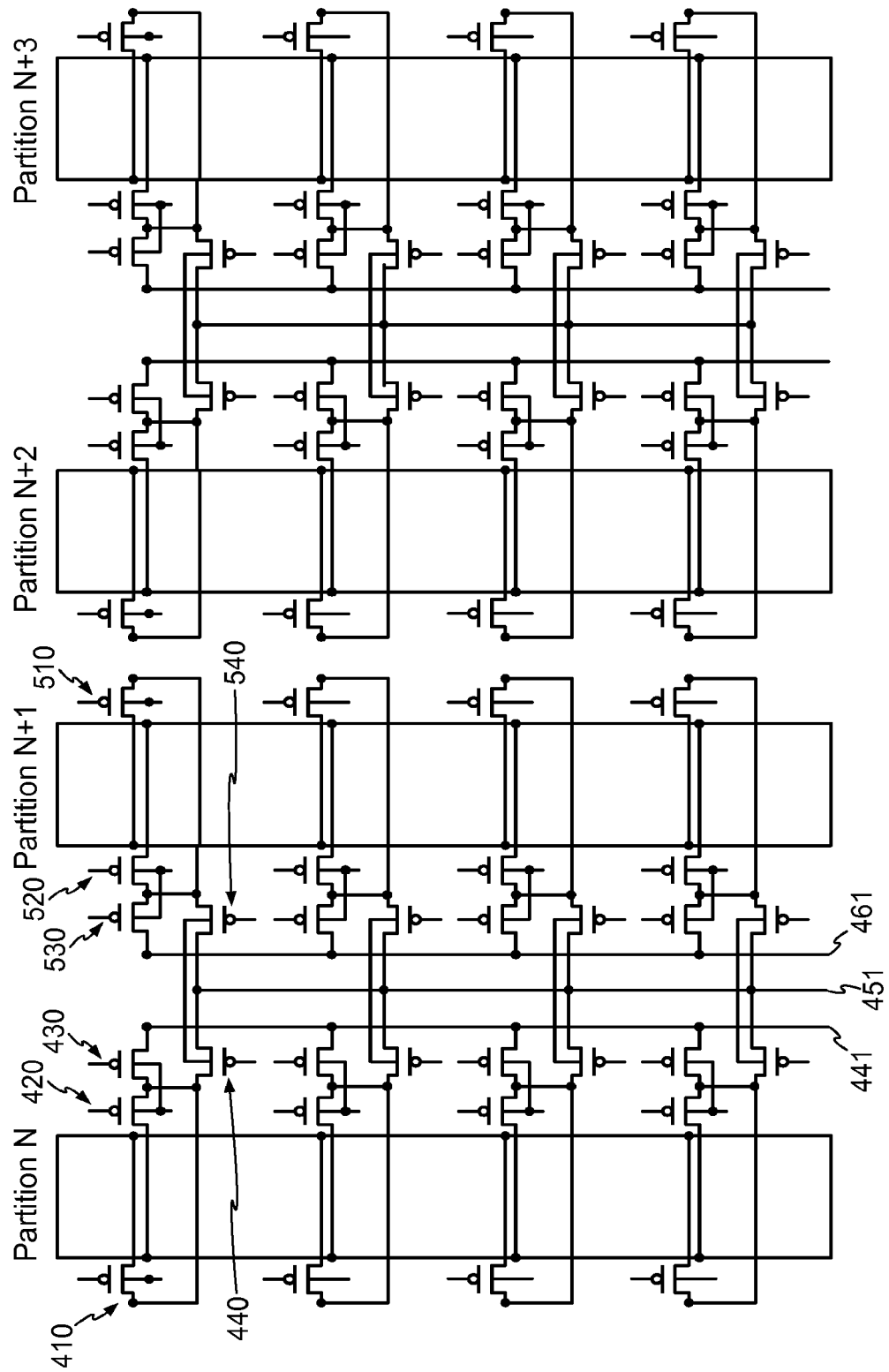
FIGS. 4 and 5 are circuit diagrams illustrating portions of the embodiment of FIGS. 2A and 2B in detail.

Referring to partition 310 and memory slice 301, for example, partition decoder 380 may be applied to X decoders of partition 310, such as, for the block configuration corresponding to tile 340, for example, X decoders 315 and 316. Partition decoder 380 may operate as a level decoder. For example, a binary digital signal coded using five bits may be capable of representing any number between one and 25 inclusive and a binary digital signal coded using four bits may be capable of representing any number between one and 24 inclusive. For example, a binary digital signal value may be converted to a 16 level signal so that a partition out of 16 possible partitions, for example, may be selected. X decoders for the selected partition may therefore be actuated so that a memory cell in a selected partition may be an object of a memory operation. In contrast, a memory operation decoder and/or memory slice decoder, referred to above as a level two Y decoder and a level one Y decoder, may work in conjunction with a partition decoder (e.g., X decoder), so as to select (e.g., designate) a memory cell and an operation to be applied to that cell. In at least one embodiment, a dual path approach may be employed, as illustrated in FIGS. 3 and 4, and as described in more detail below.

Continuing with FIG. 3, referring now to partition 320 and memory slice 301, Y decoders 385 and 386 may comprise memory slice decoders to select memory slice 301 out of 16 possible memory slices. Thus, in this illustrative example, tile 350 may be designated. Likewise, memory operation decoder 395 may comprise a memory operation decoder to select a memory operation to be applied to a memory cell in memory tile 350, for example. However, again, in at least one embodiment, decoder 395 may provide further decoding to identify the memory cell of memory tile 350 for the memory operation.

A memory slice may include a first and a second signal path for reading a memory state or for verifying/writing a memory state, such as 341 and/or 351, respectively, illustrated in FIG. 3. However, as suggested previously, for at least one embodiment, memory slice decoders, such as 385 and 386, and/or a memory operation decoder, such as 395 for the block configuration corresponding to tile 340 or 396 for the block configuration corresponding to tile 350, may apply signals to or receive signals from a signal path if reading or verifying/writing, as described below. Further, as described previously, a memory operation decoder operates to decode a particular memory operation and may also provide decoding to identify a memory cell within a memory tile to which the operation is to be applied.

A memory operation decoder, such as 395 and 396, may be in immediately adjacent block configurations and so, may be immediately adjacent one another. In at least one embodiment, effective use of semiconductor area on a die may result. For example, a memory slice may be selected if a memory operation, such as a read operation, were issued. Decoding, as suggested previously, may be accomplished, such as via decoders 380 or 381, for partition decoding, for example. Likewise, a particular memory slice may be selected via memory slice decoders, such as 385 or 386. If, for example, a memory cell for a memory tile corresponding to the selected partition and memory slice is to be verified or written to, in at least one example embodiment, signal path 351 may be selected via a memory operation decoder, such as 395 or 396. However, if a memory cell for the memory tile corresponding to the selected partition and memory slice is to be read from, signal path 341 may be selected via a memory operation decoder, such as 395 or 396. In at least one embodiment, therefore, a memory operation decoder may decode the memory operation and also decode the memory cell of the selected memory tile to be the object of the memory operation, although, of course, claimed subject matter is not limited in scope in this respect.

As indicated previously, for at least one embodiment, a set of sense circuitry may be connected, such as read sense amplifiers and/or verify sense amplifiers. It is likewise noted previously verify sense amplifiers may also operate along a common signal path with write sense amplifiers and it may therefore be convenient to have the sense amplifiers perform both operations, although this is not a requirement, of course. However, a signal path employed for verifying may likewise be employed for writing in at least one particular embodiment.

In at least one embodiment, similarly doped diffusion regions for similarly doped semiconductors switches in substantially mirrored block configurations may be arranged to electrically share a common potential signal value level. For example, referring to FIG. 3, block configurations in two adjacent partitions may be substantially mirrored, such as 340 and 350, for example. In contrast, immediately adjacent block configurations, such as 350 and 360, may be substantially similar. FIG. 4 is a circuit diagram illustrating a portion of FIGS. 2 and 3 in more detail. In FIG. 4, four immediately adjacent partitions, N, N+1, N+2, and N+3, are illustrated. It is likewise noted, for clarification purposes, that FIG. 4 represents a 90 degree rotation in comparison to FIGS. 2 and 3. For example, in FIGS. 2 and 3, tiles for a particular partition extend across a page horizontally; however, in FIG. 4, tiles for a particular partition extend vertically across a page.

Although claimed subject matter is not limited in scope in this respect, it is noted that an embodiment, as shown in FIG. 4, may comprise similarly doped semiconductor switches comprising field effect transistors (FETs), such as, in particular, for at least one embodiment, P-type FETs. P-type FETs, for example, may be employed to improve use of semiconductor area since smaller P-type FETs may be employed, as described in more detail later. Other benefits, as discussed in more detail, may also be present in some embodiments.

In at least one embodiment, block configurations may employ P-type FETs, although claimed subject matter is not limited in scope in this respect. As mentioned previously, FIG. 4 comprises a 90 degree rotation with respect FIGS. 2 and 3. For example, tiles for a particular partition in FIG. 4 are shown vertically on a page, whereas tiles for a particular partition in FIGS. 2 and 3 are shown horizontally. As discussed previously, mirror image block configurations may be provided by partition N and immediately adjacent partition N+1. Likewise, partition N+2 and partition N+3 may provide mirror image block configurations. Similarly, adjacent memory slices of respective partitions may provide substantially similar block configurations.

For purposes of illustration, note that, transistors 410, 420, 430 and 440, for example, of FIG. 4 in conjunction, may perform level one Y decoding and level two Y decoding. It may be useful to initially view transistor operation broken into separate functions, for explanation purposes, despite the observation that transistors typically or more typically tend to operation in conjunction. Using this simplification for initial ease of understanding, transistors 410 and 420 may perform level one Y decoding and, in effect, may decode a particular memory slice, so to identify a memory tile, in conjunction with partition decoding. Level two decoding may be employed to identify a memory cell of the memory tile. For example, transistors 430 and 440 may decode a memory operation to be applied and decode a memory cell of the tile for application of the particular memory operation as well. In FIG. 4, "LY1" indicates a transistor involved in level one Y decoding, whereas "L2YR" or "L2YW" indicate a transistor involved in level two Y decoding. Also, FIG. 4 indicates that illustrative circuitry may in at least one embodiment be understood to be replicated using a designation "X16." In this example embodiment, as noted previously, a tile includes 16 memory cells, whereas not all circuitry for a tile is illustrated for all memory cells in FIG. 4. Of course, claimed subject matter is not limited in this respect.

As illustrated by the circuit diagram for FIG. 4, for at least one embodiment, drains of similarly doped FETs, such as 410, 420, 430 and 440, for example, within a block configuration may be arranged to electrically share a common potential signal value level. Likewise, some immediately adjacent similarly doped FETs within a block configuration may have similarly doped N-well diffusion regions arranged to share a common potential signal value level. Therefore, immediately adjacent switches (e.g., transistors), such as 420 and 430 or 520 and 530, may have N-well diffusion regions tied to a common potential signal value level.

As discussed previously, a first signal path and second signal path, illustrated, for example, in FIG. 3, may be employed in connection with reading a memory state or writing a memory state. For example, in FIG. 3, signal path 341 may be employed for reading and signal path 351 may be employed for verifying/writing. A similar approach may be applied to FIG. 4. For example, signal path 351 in FIG. 3 may correspond to signal path 451 in FIG. 4. Likewise, signal path 341 of FIG. 3 may correspond to signal path 441/461 in FIG. 4. Although not shown, signal paths 441 and 461 may be connected electrically off the diagram in at least one embodiment. Thus, signal paths 441/461 and/or 451 may correspond to signal paths 341 and/or 351 of FIG. 3, respectively.

Again, as indicated above, transistors 410, 420, 430 and 440 may work in conjunction. A similar approach may apply to transistors 510, 520, 530 and 540. In an analogous manner, for example, transistors 540 and/or 530 may be employed for a write operation, such as via signal path 451, and/or for a read operation, such as via signal path 441/461, respectively. FIG. 4 therefore illustrates that, for at least one embodiment, a write operation and/or a read operation may be dual path, such as via 451 and/or 441/461, respectively, for example.

Thus, for at least one embodiment, signal paths, such as 441/461 and/or 451, may be capable of reading and/or writing memory states, respectively. Therefore, one partition may write a memory state while an immediately adjacent partition may read a memory state. For example, signal path 451 may be employed in connection with a write memory operation while signal path 441/461 may be employed in connection with a read operation; however, claimed subject matter is of course not necessarily limited to performing a RWW operation in this particular manner. This is merely one illustration.

N wells of immediately adjacent transistors of mirror imaged block configurations may also electrically share a potential signal level between immediately adjacent partitions. This is illustrated in FIG. 4, by transistors 440 and 540. It is noted, as indicated, that signal path 451 may be employed in writing a memory state even if signal path 441/461 is employed in reading a memory state. In at least one embodiment, dual path decoding may therefore be applied. For example, signal path 451 may impinge on partition N or N+1, while signal path 441/461 may impinge on partition N+1 or N, respectively, if desired.

An aspect of at least one embodiment may include that a memory slice decoder and a memory operation decoder may have transistors with N well diffusion regions tied to a common potential signal value level. This may occur, for example, within a partition for immediately adjacent transistors, such as 420 and 430. A benefit that this may provide in conjunction with use of P-type devices may include improved compaction. In at least one embodiment, semiconductor die area may be reduced since immediately adjacent transistors may be spaced closer together.

As indicated previously, a configuration of P-type semiconductor devices, such as within a block configuration, may be employed to select (e.g., designate) a particular memory cell of a memory tile for a selected (e.g., designated) memory operation. Commonly controlled devices of a configuration may decode a selected memory tile and non-commonly controlled devices of a configuration may decode a selected memory operation and a selected memory cell of the selected memory tile. Therefore, commonly controlled devices of a configuration may be employed as a memory slice decoder, as previously described; whereas, non-commonly controlled devices may be employed as a memory operation decoder, such as a read operation, a write operation, or a verify operation for a selected memory cell, such as 430 and 440. Of course, claimed subject matter is not necessarily limited to this approach, however.

As illustrated in FIG. 4 by transistors 410 and 420, in at least one embodiment, commonly controlled devices of configuration may be positioned on opposing sides of a selected memory cell, whereas non-commonly controlled devices of a configuration may occupy a position on a same side of a selected memory cell, illustrated, for example by 430 and 440. Hence, for at least one embodiment, level one Y decoding, such as by 410 and 420, may be "in effect" furthered or even perhaps, in some embodiments, completed by level two Y decoding, such as by 430 and 440, as one illustrative example. However, an arrangement of transistors with this layout may result in better use of semiconductor die area.

Again, as previously described, in at least one embodiment, P-type FETs may be employed. Therefore, non-commonly controlled FETs of different configurations that are immediately adjacent one another may have N well diffusion regions coupled to share a common "body" bias voltage value level, such as 440 and 540, as an example.

An additional benefit of employing P-type devices includes the capability to deliver relatively high voltage signal levels, such as about 4 volts, as a non-limiting example, but with a thinner oxide for a device gate, for example, then for an N-type device. For a P-type device to be "on," for example, zero volts may be employed on its gate; whereas, five or ten volts may be employed for an N-type device to be "on." To state this observation another way, P devices are able to be grounded for operation. Therefore, gate oxides need not be as thick as for N-type devices, typically.

Another feature, for at least one embodiment, however, relates to employing a memory slice decoder, for example, in connection with reading a memory state and/or writing a memory state. Use of P-type devices may, for example, permit varying voltage levels to be employed. A read operation may, for example, occur at a voltage level so as not result in disturbing operation of other devices. For example, through use of P-type devices, transistors may be deselected by a source voltage VCC, which may have a potential exceeding a potential applied to a transistor gate during a read memory operation. Risk of a forward bias may therefore be adequately handled and reduced despite dual use of transistors for different types of memory operations at different times. For example, a small negative voltage may be employed in a read operation; however, deselected transistors along a common signal path should not be become active if VCC is a positive voltage signal level, for example. In addition, this may be accomplished in at least one embodiment while also using thinner oxides, as previously suggested, and a smaller die area.

In at least one embodiment, an executed read memory operation may pass a voltage level signal level of a value of about 1.2 volts. Likewise, an executed write memory operation may pass a higher voltage, such as about four volts, for example. For a transistor to be conductive during a read operation, a relatively small negative voltage may be placed on a selected gate.

This voltage signal level approach for read operations and write operations may result in power efficiency. For example, in the case of a write operation, state changes and associated movement of voltage signal levels may take place over a longer period of time. Therefore, although a write operation may involve higher voltage signal levels than a read operation; greater length of time to execute an operation may be a balancing factor to assist in efficient power utilization on average. In contrast, as indicated, a read operation may employ lower voltage signal levels in general.

As previously indicated, employing P-type devices may reduce oxide stress. For example, a gate may be grounded for a transistor selected to conduct during a write operation. For a write operation for a particular partition, however, N wells of deselected transistors may be biased to VCC. A benefit is that forward biasing of a deselected transistor during a write operation may be less likely in at least one embodiment. Likewise, decoders with deselected transistors may have N wells also biased to VCC providing a similar benefit.

Another benefit of employing P-type devices may include employing VCC as a common potential for relatively low voltage signal levels, such as may be used for a read operation. An external power source, for example, may be employed to provide VCC. Typically, an external power source may be desirable for power efficiency over generating voltage potential on chip, such as through use of charged pumps, band gaps or similar types of circuit approaches.

Figure 5:
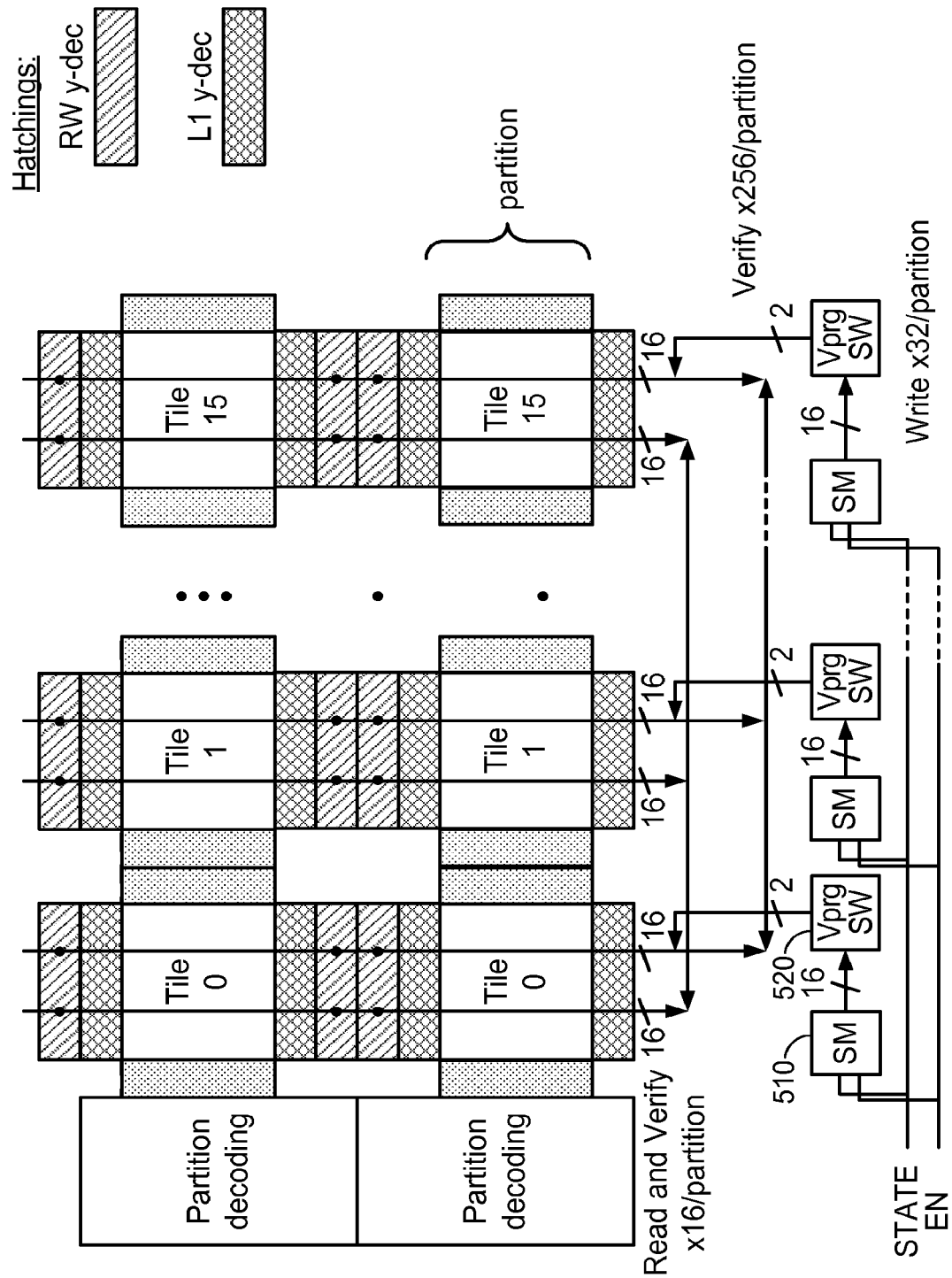
Figure 6:
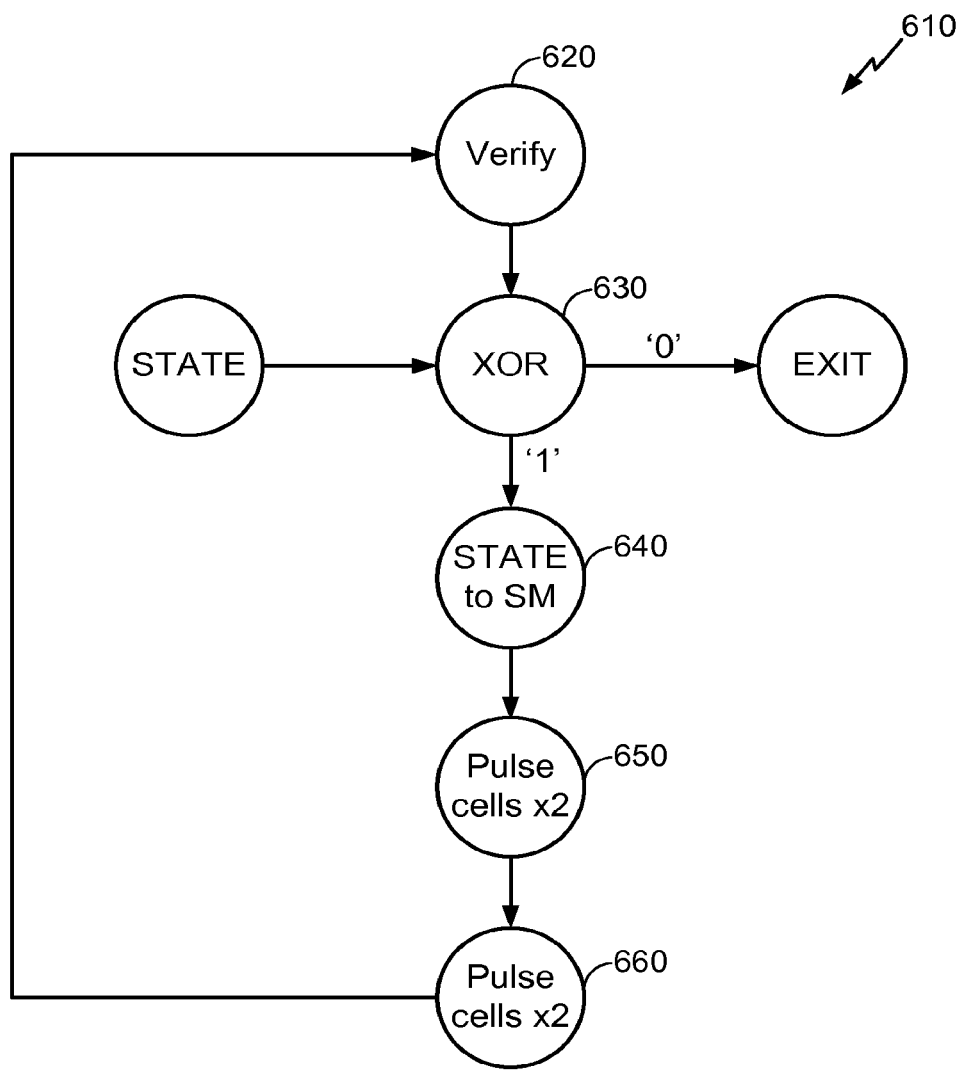
FIG. 6 is a flow chart illustrating an embodiment of a process to be applied to verify memory cell contents for a memory array.

FIG. 5 is a schematic diagram illustrating an embodiment including a controller (e.g., an on-die controller), such as state machine 510. It is noted that the upper portion of FIG. 5 is shown in FIG. 3. At least one embodiment may include a verify operation in conjunction with a write operation, as described previously. FIG. 6 is a flow chart illustrating an embodiment of a process 610 that may be employed in connection with a memory tile array.

Referring to FIG. 6, a verify operation may be applied, such as at 620 as an example, to a set of sense amplifiers. For example, a verify operation may occur in a circumstance in which memory states may have been written to some or to all sense amplifiers. Sense amplifier memory states may be compared against memory states to be written to memory cell locations, such as at 630 as an example. After a comparison, memory states for memory cell locations in which contents of a memory cell location is to be altered may be loaded into a state machine, such as at 640 as an example.

A comparison typically may save power and time and may improve cell endurance since programming is not applied to cells that are not changing memory state. After memory states have been loaded into a state machine, the state machine may drive a programming pulse process, as shown, for example, by FIG. 6. In at least one embodiment, a state machine may select some cells to program pulse. For example, a trade off may be made between speed and power utilization. A higher number of cells may be programmed per pulse resulting in greater speed, but this may also result higher power utilization. However, pulsing fewer cells, such as two cells per pulse, for example, employs less current. Of course, claimed subject matter is not limited in scope to a particular number of cells to pulse for a given embodiment.

Referring to FIG. 5, a state machine may select two cells at a time, such as in a switch 520, until cells to be pulsed are exhausted. It is noted that "EN" refers to a enable signal. Various architectures may employ different numbers of cells per clock pulse, of course. Furthermore, as discussed previously, a verify and a write memory operation may share some available signal path or transistor resources in at least one embodiment. As FIG. 6 illustrates, for at least one embodiment, after pulsing, contents may be re-verified so that if any memory states fail to be stored, pulsing may be repeated until memory states are written as desired.

Although a 16×16 array of tiles is employed, claimed subject matter is of course not limited to this particular arrangement. In this particular arrangement, as described previously, 16 tiles, for example, results in, 256 memory states capable of being read and/or written at a time. A host of different arrangements are possible within the scope of claimed subject matter. For example, through a mechanism, such as level one and level two decoding, as described previously, it may be possible and desirable to balance semiconductor diffusion with metal density.

For example, imagine as a simple example, 32 memory cells. If level one decoding has four divisions, (e.g., 22) for a level one division, eight level two cells (e.g., 23) are to be decoded. However, instead, with two divisions for level one decoding, there are 16 cells to be decoded for level two decoding. Therefore, effective balancing of semiconductor diffusion and metal may be possible. For example, one scheme may tend toward reading or writing to memory cells relatively directly, for example, whereas another may involve more signal decoding for reading or writing to take place.

For at least one embodiment, as previously described, a method of selecting a memory cell for reading and/or writing a memory state may include the following. Signals may be transmitted to decode a selected memory cell and to decode a selected memory operation for the selected memory cell. For example, to read a memory state may involve applying 1.2 volts, as a possible example, while to write a memory state may involve applying 4 volts, as a possible example. Transmitted signals selecting a read memory operation may have a different extreme signal value level then transmitted signals selecting a memory write operation. For example, in at least one embodiment, a small negative voltage may be applied to a selected gate for a read operation in comparison to a gate being grounded for a write operation. For example, for a read operation, negative voltage signals levels may assist to maintain sufficient conductance of a P-type transistor if managing relatively low voltages, such as 1.2 volts. Furthermore, as described previously, for at least one embodiment, memory states of a first set of one or more memory cells may be read while memory states of a second set of one or more memory cell may be written, for example.

Some portions of the preceding detailed description have been presented in terms of logic, algorithms or symbolic representations of operations on binary states stored within a memory of a specific apparatus (e.g., a special purpose computing device or platform). In the context of this particular specification, the term specific apparatus or the like includes a general purpose computer once it is programmed to perform particular functions pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated as electronic signals representing information. It has proven convenient at times, principally for reasons of common usage, to refer to such signals as bits, data, values, elements, symbols, characters, terms, numbers, numerals, information, or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining", "establishing", "obtaining", "identifying", "selecting", "generating", or the like may refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device. In the context of this particular patent application, the term "specific device" may include a general purpose computer once it is programmed to perform particular functions pursuant to instructions from program software.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and storage of charge or a release of stored charge. Likewise, in other memory devices, a change of state may comprise a physical change or transformation in magnetic orientation or a physical change or transformation in molecular structure, such as from crystalline to amorphous or vice-versa. In still other memory devices, a change in physical state may involve quantum mechanical phenomena, such as, superposition, entanglement, or the like, which may involve quantum bits (qubits), for example. The foregoing is not intended to be an exhaustive list of all examples in which a change in state for a binary one to a binary zero or vice-versa in a memory device may comprise a transformation, such as a physical transformation. Rather, the foregoing is intended as illustrative examples.

A computer-readable (storage) medium typically may be non-transitory or comprise a non-transitory device. In this context, a non-transitory storage medium may include a device that is tangible, meaning that the device has a concrete physical form, although the device may change its physical state. Thus, for example, non-transitory refers to a device remaining tangible despite this change in state.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

Methodologies described herein may be implemented by various approaches depending, at least in part, on applications according to particular features or examples. For example, such methodologies may be implemented in hardware, firmware, or combinations thereof, along with software. In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, microprocessors, electronic devices, other devices units designed to perform the functions described herein, or combinations thereof.

In the preceding detailed description, numerous specific details have been set forth to provide a thorough understanding of claimed subject matter. However, it will be understood by those skilled in the art that claimed subject matter may be practiced without these specific details. In other instances, methods or devices that would be known by one of ordinary skill have not been described in detail so as not to obscure claimed subject matter.

While there has been illustrated or described what are presently considered to be example features, it will be understood by those skilled in the art that various other modifications may be made, or equivalents may be substituted, without departing from claimed subject matter. Additionally, many modifications may be made to adapt a particular situation to conform to teachings of claimed subject matter without departing from one or more central concept(s) described herein. Therefore, it is intended that claimed subject matter not be limited to particular examples disclosed, but that such claimed subject matter may also include all aspects falling within the scope of appended claims, or equivalents thereof.

What is claimed is:

1. A memory device, comprising:
a memory array that comprises two or more block configurations, each of the two or more block configurations comprising an arrangement of transistors comprising a first group of transistors configured to receive a memory operation and a second group of transistors configured to select a slice of the memory array representing a respective combination of row lines and column lines of the memory array, wherein at least two of the block configurations are mirrored; and
a memory controller in electronic communication with the row lines and the column lines, wherein the slice of the memory array comprises a first signal path associated with a read operation and a second signal path associated with a write operation, wherein at least two transistors of the first group of transistors electrically connects a selected slice of the memory array to both the first signal path and the second signal path, wherein the first group of transistors is positioned on a same side of the selected slice of the memory array and transistors of the second group of transistors are positioned on opposing sides of the selected slice of the memory array, [[and]] wherein each transistor of the first group of transistors is coupled to each transistor of the second group of transistors, and wherein the transistors in the mirrored block configurations comprise p-type field-effect transistors, the p-type field-effect transistors providing a smaller semiconductor area in a block configuration relative to n-type field-effect transistors.

2. The memory device of claim 1, wherein each of the two or more block configurations comprises a memory slice decoder a memory operation decoder.

3. The memory device of claim 1, wherein identically doped diffusion regions of transistors in the mirrored block configurations electronically share a common potential signal level.

4. The memory device of claim 1, wherein a subset of the transistors in the two or more block configurations have similarly doped n-well diffusion regions and are arranged to electronically share a common potential signal level.

5. The memory device of claim 1, further comprising:
a voltage source configured to apply a negative voltage to a gate of a p-type field-effect transistor from at least one of the one or more memory operation decoders during a read operation.

6. The memory device of claim 1, further comprising:
a first voltage source configured to apply a ground signal to a gate of a p-type field-effect transistor from at least one of the one or more memory operation decoders during a write operation.

7. The memory device of claim 6, further comprising:
a second voltage source configured to apply a source voltage to n-wells of one or more deselected transistors from at least one of the one or more memory operation decoders during a write operation.

8. The memory device of claim 1, further comprising:
a decoder to provide a signal to at least one of the two or more block configurations, the at least one of the two or more block configurations is configured to select a particular partition of the memory array based at least in part on the signal.

9. The memory device of claim 1, wherein at least one of the two or more block configurations is configured to perform a read-while-write operation.

10. A memory device comprising:
a memory controller in electronic communication with one or more memory cells, the memory controller operable to:
select a memory cell;
apply a first voltage to a first signal path associated with a read operation, and
apply a second voltage to a second signal path associated with a write operation;
a memory array comprising one or more memory cells and two or more block configurations, each of the two or more block configurations comprising:
a first transistor configured to receive a first signal from the memory controller to select a first memory cell of the one or more memory cells, the first transistor coupled with at least one of the one or more memory cells and the first signal path;
a second transistor configured to receive a second signal from the memory controller to select a second memory cell of the one or more memory cells, the second transistor coupled with at least one of the one or more memory cells and the second signal path;
a third transistor configured to receive a third signal from the memory controller to receive the read operation, the third transistor coupled with the first memory cell or the second memory cell and the first signal path; and
a fourth transistor configured to receive a fourth signal from the memory controller to receive the write operation, the fourth transistor coupled with the first memory cell or the second memory cell and the second signal path,
wherein the third transistor and the fourth transistor electrically connect at least one of the first or second selected memory cell to both the first signal path and the second signal path,
wherein the first transistor and the second transistor are positioned on opposing sides of the selected memory cell at a time period when the first memory cell or the second memory cell is selected,
wherein the third transistor and the fourth transistor are positioned on a same side of the selected memory cell at the time period when the first memory cell or the second memory cell is selected,
wherein the first transistor and the second transistor are each coupled to the third transistor and the fourth transistor, and wherein the first transistor, the second transistor, the third transistor, and the fourth transistor of the two or more block configurations comprise p-type field-effect transistors, the p-type field-effect transistors providing a smaller semiconductor area in a block configuration relative to n-type field-effect transistors.

11. The memory device of claim 1, wherein the transistors are identically doped.

12. The memory device of claim 10, wherein the first transistor, the second transistor, the third transistor, and the fourth transistor are identically doped.

13. The memory device of claim 1, wherein the first signal path is employed in a read operation associated with a first memory partition and the second signal path is employed in a write operation associated with a second memory partition at a same time period.

14. The memory device of claim 10, wherein the first signal path is employed in a read operation associated with a first memory partition and the second signal path is employed in a write operation associated with a second memory partition at a same time period.

* * * * *